United States Patent
Takeichi et al.

(10) Patent No.: US 6,632,320 B1
(45) Date of Patent: Oct. 14, 2003

(54) ADHESIVE MATERIAL AND CIRCUIT CONNECTION METHOD

(75) Inventors: Motohide Takeichi, Kanuma (JP); Junji Shinozaki, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/631,280

(22) Filed: Aug. 3, 2000

(30) Foreign Application Priority Data

Aug. 19, 1999 (JP) .......................................... 11-233300

(51) Int. Cl.$^7$ .............................................. B32B 31/00
(52) U.S. Cl. ...................... 156/327; 156/306.9; 524/428
(58) Field of Search ............... 156/327, 306.9; 524/428

(56) References Cited

U.S. PATENT DOCUMENTS

| | | | |
|---|---|---|---|
| 4,818,823 A | * 4/1989 | Bradley ........................ 156/3.3 |
| 5,288,769 A | * 2/1994 | Papageorge et al. ......... 524/428 |
| 5,292,688 A | 3/1994 | Hsiao et al. |
| 5,683,806 A | * 11/1997 | Sakumoto et al. .......... 525/139 |
| 5,814,180 A | * 9/1998 | King .......................... 156/325 |
| 6,140,402 A | 10/2000 | Dietz et al. |

FOREIGN PATENT DOCUMENTS

| EP | 0 933 809 A2 | 8/1999 |
|---|---|---|
| JP | 06-349339 | 12/1994 |
| JP | 10-067883 | 3/1998 |
| JP | A-11-61088 | 3/1999 |
| JP | 11-106480 | 4/1999 |
| JP | 11-288979 | 10/1999 |

* cited by examiner

*Primary Examiner*—Jeff H. Aftergut
(74) *Attorney, Agent, or Firm*—Oliff & Berridge, PLC

(57) ABSTRACT

An adhesive material is used for connecting a protuberant electrode of an electronic component to a terminal electrode of a circuit board for carrying said electronic component through the adhesive material containing at least one curable resin and inorganic particles. The adhesive material is characterized in that as to the inorganic particles, their specific surface area S (m$^2$/g) satisfies Equation (1) below, their mean particle size $D_1$ ($\mu$m) and maximum particle size $D_2$ ($\mu$m) respectively satisfy Equations (2) and (3) below, $$3<S<17 \tag{1}$$

$$D_1 \leq 5 \tag{2}$$

$$D_2 \leq 0.5(h_1+h_2) \tag{3}$$

(wherein $h_1$ represents the height of the protuberant electrode in the electronic component, and $h_2$ represents the height of the terminal electrode in the circuit board), and the content of said inorganic particles is 10 to 60 vol %.

3 Claims, 1 Drawing Sheet

ADHESIVE MATERIAL AND CIRCUIT CONNECTION METHOD

BACKGROUND OF THE INVENTION

1. Field of the Invention

The present invention relates to an adhesive material for connecting a protuberant electrode of a semiconductor element or the like to a terminal electrode of a circuit board for carrying said electronic component.

2. The Description of the Related Art

IC packages in which semiconductor elements are mounted on packaging substrates which have a relatively larger surface area than the semiconductor element have conventionally been mounted on motherboards in portable electronic devices, e.g., cellular telephones. Recently, however, there has been a trend towards lighter, thinner, shorter and smaller electronic devices as well as towards increased functionality.

Accompanying this trend there has been a practice of flip-chip mounting the semiconductor element itself on the motherboard in a bare-chip state and a use of chip size packages (CSP) which have been mounted on packaging substrates which are roughly the same size as the semiconductor element, in place of the conventional IC package. In such cases, an insulating adhesive in the form of a liquid, paste or film, or an anisotropically conductive adhesive in the form of a paste or film, in which conductive particles are dispersed in these insulating adhesives, are used when the protuberant electrode (bump) of the bare chip or CSP is to be connected to the terminal electrode of the motherboard.

Stress becomes concentrated in the protuberant electrode of the bare chip due to the difference in thermal expansion coefficient between the motherboard and the bare chip (or CSP) in the portions where connections are made by using such adhesives. This leads to the drawback of the protuberant electrode frequently separating or peeling away, which causes the conductivity resistance to increase, poor connections to be formed, and the reliability of the connections to be markedly diminished.

Moreover, scatter in the heights of the bare chip protuberant electrodes also leads to scatter in the distances between the motherboard connecting terminals and the corresponding bare chip protuberant electrodes. This leads to the drawback that the reliability of the connections shall not improve.

Accordingly, it has been proposed that in order to ensure the reliability of the connection between the motherboard and the bare chip, an inorganic filler with a mean particle size of 3 microns or less should be compounded with the insulating adhesive or anisotropically conductive adhesive at a ratio of 5 to 200 wt pts per 100 wt pts adhesive resin composition, to increase viscosity and improve adhesive strength (Japanese Patent Application Laid-Open No. (HEI) 11-061088).

However, as disclosed in Japanese Patent Application Laid-Open No. (HEI) 11-061088, sufficient reliability in the adhesion between the motherboard and the bare chip cannot be assured, if the inorganic filler particle size and compounding amounts are merely specified.

SUMMARY OF THE INVENTION

With the foregoing problems of the prior art in view, it is an object of the present invention to eliminate any scatter in the distance between a protuberant electrode of a semiconductor element or the like, and a terminal electrode of a motherboard or other circuit board, while enabling the connections to be satisfactorily reliable.

The present inventors perfected the present invention based on the discovery that the aforesaid object can be achieved when connecting a protuberant electrode of a semiconductor element or the like to a terminal electrode of a circuit board for carrying said electronic component, through an adhesive material that contains at least one curable resin and inorganic particles, not solely by determining the mean particle size and compounding amount of the inorganic particles used, but by establishing the specific surface area of the inorganic particles within a prescribed range, and establishing the maximum particle size at one half or less of the sum of the height of the protuberant electrode on the electronic component and the height of the terminal electrode of the circuit board.

In other words, the present invention provides an adhesive material for connecting a protuberant electrode of an electronic component (preferably a bare chip or another semiconductor element) to a terminal electrode of a circuit board for carrying said electronic component through the adhesive material containing at least one curable resin and inorganic particles, said adhesive material being characterized in that as to the inorganic particles, their specific surface area S ($m^2/g$) satisfies Equation (1) below, their mean particle size $D_1$ ($\mu$m) and maximum particle size $D_2$ ($\mu$m) respectively satisfy Equations (2) and (3) below, $$3 < S \leq 17 \tag{1}$$

$$D_1 \leq 5 \tag{2}$$

$$D_2 \leq 0.5(h_1 + h_2) \tag{3}$$

(wherein $h_1$ represents the height of the protuberant electrode in the electronic component, and $h_2$ represents the height of the terminal electrode in the circuit board), and the content of said inorganic particles is 10 to 60 vol %.

Furthermore, the present invention provides a circuit connection method, in which a protuberant electrode on an electronic components that contains said protuberant electrode (preferably a bare chip or another semiconductor element) is connected to a terminal electrode of a circuit board for carrying said electronic component through an adhesive material containing at least one curable resin and inorganic particles, said circuit connection method being characterized in that an adhesive material in which inorganic particles whose specific surface area S ($m^2/g$) satisfies Equation (1) below and whose mean particle size $D_1$ ($\mu$m) and maximum particle size $D_2$ ($\mu$m) respectively satisfy Equations (2) and (3) below $$3 < S \leq 17 \tag{1}$$

$$D_1 \leq 5 \tag{2}$$

$$D_2 \leq 0.5(h_1 + h_2) \tag{3}$$

(wherein $h_1$ represents the height of the protuberant electrode in the electronic component, and $h_2$ represents the height of the terminal electrode in the circuit board) are dispersed in a curable resin in an amount of 10 to 60 vol %, is used as the adhesive material.

DETAILED DESCRIPTION OF THE INVENTION

Figure 1:
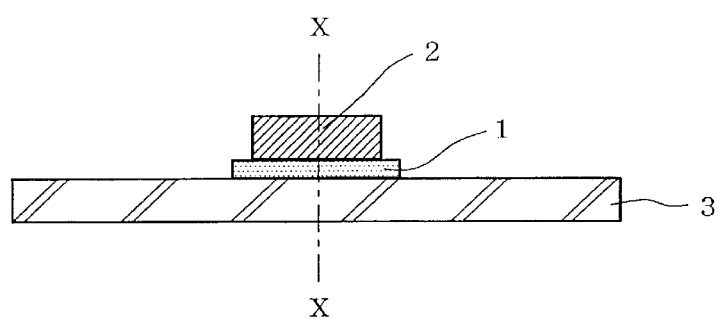
FIG. 1 is a cross section of a connection structure used in the evaluation of the workability of the adhesive materials.

The present invention is described in further detail below.

The adhesive material of the present invention connects a protuberant electrode of an electronic component to a terminal electrode of a circuit board for carrying said electronic component and contains at least one curable resin and inorganic particles. Therefore, as to the inorganic particles, it is necessary for their specific surface area S (m²/g), as measured by the BET method, to satisfy Equation (1) below, and their mean particle size (the mean being taken as the result of 100,000 particles being measured three times) $D_1$ (μm) and the maximum particle size $D_2$ (μm), as measured according to the Coulter counter method, to satisfy respectively Equations (2) and (3) below, $$3 < S \leq 17 \quad (1)$$

$$D_1 \leq 5 \quad (2)$$

$$D_2 \leq \tfrac{1}{2}(h_1 + h_2) \quad (3)$$

(wherein $h_1$ represents the height of the protuberant electrode in the electronic component, and $h_2$ represents the height of the terminal electrode in the circuit board) This is because when the specific surface area S of the inorganic particles is 3 m²/g or less, the particle sizes becomes too large, which may cause the protective film on the connecting side of the electronic component to be damaged. When the specific surface area S exceeds 17 m²/g, the flowability of the adhesive material diminishes, requiring great pressure to make the connection, and the bonding workability decreases, making it increasingly difficult to eliminate scatter in the distance between the protuberant electrode of electronic, and the terminal electrode of a motherboard or other circuit board. Moreover, when the mean particle size $D_1$ (μm) of the inorganic particles exceeds 5 μm, there is an increased likelihood that those inorganic particles which have been sandwiched between the protuberant electrode and the circuit board will hinder the electrical connection.

On the other hand, when the maximum particle size $D_2$ (μm) of the inorganic particles exceeds one half of the sum of the height of the protuberant electrode in the electronic component $h_1$(μm) and the height of the terminal electrode in the circuit board $h_2$ (μm), the inorganic particle sizes becomes too large, which may cause the protective film on the connecting side of the electronic component to be damaged.

It is preferable for the maximum particle size $D_2$ (μm) of the inorganic particles not to exceed 15 μm in general.

Moreover, it is preferable for the inorganic particles to be used such that their mean particle size $D_1$ further satisfies the Equation (4) below.

$$0.1(h_1 + h_2) \geq D_1 \quad (4)$$

The amount of such inorganic particles to be compounded in the adhesive material is 10 to 60 vol %, and preferably 20 to 50 vol %. This is because at less than 10 vol % reliable electrical connections become harder to obtain, while in excess of 60 vol % the flowability of the connecting material during connection will worsen considerably, which will hinder a satisfactory connection from being obtained.

Metal oxides such as alumina or silica, metal nitrides such as aluminum nitride or silicon nitride, or other substances can be used as a material for the aforedescribed inorganic particles. Any well-known waterproofing treatment can be performed on these materials.

A thermosetting resin used as an adhesive component when carrying out conventional flip-chip mounting of the semiconductor element on the motherboard can be used as the curable resin which constitutes the adhesive material; e.g., epoxy resin, urethane resin, unsaturated polyester resin or the like can be exemplified. Moreover, curable resins which contain functional groups that react under irradiation by ultraviolet rays or another specific wavelength; e.g., acrylate resins, methacrylate resins or the like can be exemplified. It is allowable for these to be used in mixtures of two or more.

The use of a liquid-form curable resin which exhibits a viscosity of 500 cps or less, and preferably 200 cps or less, at 100° C. as at least one curable resin in the present invention is preferable from the perspective of ensuring the workability (coatability etc.) of the adhesive material. It is preferable for the amount of such a curable resin, which has a viscosity of 500 cps or less at 100° C., compounded in the overall curable resin to be at least 20 wt %.

A curing agent; e.g., imidazole-, acid anhydride-, hydrazide-, and dicyandiamide-based curing agents, can be compounded with the adhesive material of the present invention. Of these, a latent curing agent which has been latentized is preferably used.

Conductive particles with a mean particle size of 0.5 to 8.0 μm can be additionally included in the adhesive material of the present invention. These will allow the adhesive material to be used as an anisotropically conductive adhesive. Conductive particles which have conventionally been used in anisotropically conductive adhesives can be used as these conductive particles; e.g., metal particles such as solder, nickel and the like, complex particles in which a metal plating layer has been formed on the surface of the resin particles, particles in which an insulating coating has been formed on the surface of these particles, and the like can be exemplified. The amount of conductive particles to be compounded can be suitably determined according to the type of conductive particle and application of the adhesive.

An adhesive material as described in the foregoing should have its coefficient of moisture absorption be 1.5 wt % or less in a 85° C., 85% RH atmosphere. This will prevent any moisture from penetrating into the bonding sites between the electronic component which contains the protuberant electrode, which is the object of application for the adhesive material of the present invention, and the terminal electrode of the circuit board, and will enable the reliability of the connections to be improved.

The coefficient of moisture absorption for the adhesive material can be determined from e.g. the change in weight over the time that an adhesive material, which has been molded into a cylindrical shape (diameter: 5 mm; height: 15 mm) and dried for one hour at 130° C., is left to stand thereafter for 168 hours in an atmosphere of 85% RH at 85° C.

The adhesive material of the present invention can be manufactured by uniformly mixing a curable resin, inorganic particles and various additives which can be compounded according to need. In such cases, the adhesive material can be formed as a liquid or paste form by adjusting the compounding ratio of the liquid-form curable resin in the overall curable resin. If the adhesive material is made into a film, moreover, it is preferable for a curable resin, inorganic particles and various additives which can be compounded according to need to be mixed uniformly to prepare a coating solution, applying this coating solution onto a release sheet, and thereafter drying it.

There is no especial limitation on the circuit board which is used to carry the electronic components; a conventional rigid or flexible circuit board or the like can be used.

The aforedescribed adhesive material of the present invention can be desirably used in a circuit connection method in which a protuberant electrode on electronic components, which contain said protuberant electrode, is connected to a terminal electrode of a circuit board for carrying said electronic component.

EXAMPLES

The present invention will be described below in detail.

Examples 1 to 8 and Comparative Examples 1 to 7

An adhesive material in the form of a film ("adhesive film" below) was manufactured by preparing a coating solution by mixing silica, as shown in Table 1, and toluene, with a mixture of 20 wt parts of an epoxy resin (4032D (viscosity: 200 cps/100° C.); manufactured by Dainippon Ink Co.), 20 wt parts of an epoxy resin (EP828 (viscosity: 150 cps/100° C.); manufactured by Yuka Shell Epoxy), 20 wt parts of a phenoxy resin (YP50; manufactured by Toto Kasei) and 40 wt parts of an imidazole curing agent (HX3941; manufactured by Asahi Kasei), in the compounding amounts and content by volume (%) shown in Tables 2 and 3, applying the coating solution onto a release sheet such that the dry thickness was 40 $\mu$m, and drying it in a hot air circulating oven.

TABLE 1

| Type of silica | Mean particle size $D_1$ ($\mu$m) | Maximum particle size $D_2$ ($\mu$m) | BET specific surface area S ($m^2$g) |
|---|---|---|---|
| Silica 1 | 0.5 | 15 | 3 |
| Silica 2 | 0.5 | 8 | 17 |
| Silica 3 | 3 | 8 | 95 |
| Silica 4 | 1.5 | 8 | 11 |
| Silica 5 | 0.5 | 35 | 4 |
| Silica 6 | 0.5 | 10 | 20 |

TABLE 2

| | Examples (wt pts) | | | | | | | |
|---|---|---|---|---|---|---|---|---|
| | 1 | 2 | 3 | 4 | 5 | 6 | 7 | 8 |
| Silica 1 | 70 | 100 | 150 | — | — | — | — | — |
| Silica 2 | — | — | — | 100 | — | — | — | — |
| Silica 4 | — | — | — | — | 30 | 100 | 150 | 200 |
| Content by volume (%) | 28 | 35 | 45 | 35 | 14 | 35 | 45 | 52 |

TABLE 3

| | Comparative Examples (wt pts) | | | | | | |
|---|---|---|---|---|---|---|---|
| | 1 | 2 | 3 | 4 | 5 | 6 | 7 |
| Silica 2 | 15 | — | — | — | — | — | — |
| Silica 3 | — | 30 | 100 | — | — | — | — |
| Silica 5 | — | — | — | 30 | 100 | — | — |
| Silica 6 | — | — | — | — | — | 30 | 100 |
| Content by volume (%) | 7.6 | 14 | 35 | 14 | 35 | 14 | 35 |

Evaluation

The adhesive materials of the respective Examples and Comparative Examples were evaluated for their coefficient of moisture absorption, reliability of connection and workability (indentation).

Coefficient of Moisture Absorption (%)

The adhesive materials of the respective Examples and Comparative Examples were molded into a cylindrical shape (diameter: 5 mm; height: 15 mm) and dried at 130° C. for one hour, after which their weights were measured. The molded articles were then left to stand for 168 hours in an atmosphere of 85% RH at 85° C., after which their weights were again measured. The coefficient of moisture absorption was calculated from the difference (change in weight) between these two sets of measurement data. The results obtained are shown in Table 4.

Reliability of Connection

The adhesive films of the respective Examples and Comparative Examples were arranged and positionally aligned between a silicon IC chip (6.3 mm square/0.4 mm thick), on the reverse side of which had been established 160 gold-plated bumps which were 20 $\mu$m high (height $h_1$=20 $\mu$/pitch= 150 $\mu$m), and a glass epoxy substrate (40 mm square/0.6 mm thick), on which had been formed a copper wiring (thickness (electrode height) $h_2$=12 $\mu$m) which had been treated with a nickel-gold plating. A connected article was thus obtained by using a flip-chip bonder to connect them (connecting conditions: 180° C.; 20 seconds, 100 g/bump).

After the connecting had been completed, the connected article was left to stand for 186 hours in an atmosphere of 70% RH at 30° C. and then twice passed through a reflow furnace at 240° C. (max). The resistance of the connecting sites was measured using the 4 terminal method. After the measuring, a pressure cooker treatment (121° C.; 2.1 atm; 100% RH) was performed on the connected bodies for 200 hours, after which the resistance of the connecting sites was again measured and the resistance increase ($\Delta\Omega$) before and after the pressure cooker treatment was determined. The term "good" in Table 4 means where the resistance increase at the connecting sites was less than 0.5$\Omega$ (preferable), while the terms "not good" mean where the resistance increase was 0.5$\Omega$ or more, or when the connections failed. The results obtained are shown in Table 4.

Workability

The adhesive materials 1 of to Examples 1, 2 and 3 as well as those of Comparative Examples 3 and 7, were arranged between a bumpless silicon dummy chip 2 (6.3 mm square/ 0.4 mm thick) and a circuit-less glass substrate 3 (15 mm×80 mm/1.2 mm thick), subjected to thermocompression bonding for 20 seconds at 180° C. under the indentation strength conditions shown in Table 5, and the amounts ($\mu$m) to which the chips were indented at the respective indentation strengths (kgf) were visually assessed along the x—x cross-section of the connected article, as shown in FIG. 1. The results obtained are shown in Table 5. An indentation amount(or distance) of at least 10 $\mu$m at a 1 kgf indentation strength and at least 15 $\mu$m at an indentation strength of 2 kgf is normally desirable.

TABLE 4

| Adhesive film | Coeff. of moisture absorption (%) | Connection reliability ($\Delta\Omega$)/evaluation |
|---|---|---|
| Example 1 | 2.0 | 0.21/good |
| Example 2 | 1.7 | 0.23/good |
| Example 3 | 1.0 | 0.28/good |
| Example 4 | 1.3 | 0.17/good |

TABLE 4-continued

| Adhesive film | Coeff. of moisture absorption (%) | Connection reliability (ΔΩ)/evaluation |
|---|---|---|
| Example 5 | 1.7 | 0.39/good |
| Example 6 | 1.3 | 0.18/good |
| Example 7 | 1.1 | 0.09/good |
| Example 8 | 0.8 | 0.07/good |
| Comparative Example 1 | 2.2 | 1.31/not good |
| Comparative Example 2 | 1.7 | 2.95/not good |
| Comparative Example 3 | 1.6 | -*/not good |
| Comparative Example 4 | 1.9 | 1.64/not good |
| Comparative Example 5 | 1.6 | 0.84/not good |
| Comparative Example 6 | 2.0 | 2.16/not good |
| Comparative Example 7 | 1.5 | -*/not good |

-*: no conduction obtained following initial connection

TABLE 5

| Adhesive film | Indentation strength (kgf) | Indentation amount (μm) |
|---|---|---|
| Example 1 | 2 | 20 |
| Example 2 | 1 | 10 |
|  | 2 | 18 |
|  | 4 | 29 |
| Example 3 | 2 | 12 |
| Comparative Example 3 | 1 | 7 |
|  | 2 | 15 |
|  | 4 | 24 |
| Comparative Example 7 | 1 | 1 |
|  | 2 | 3 |
|  | 4 | 7 |

As is evident from Table 4, the adhesive films of Examples 1 to 8, which satisfied the relationships in Equations (1) to (3), all displayed good connection reliability. Moreover, as can be understood from Table 5, the wordability of at least the adhesive films of Examples 1to 3was also good.

Conversely, the adhesive film of Comparative Example 1, which showed a silica volume content below the lower limit (10%), had a relatively high coefficient of moisture absorption and inadequate connection reliability. Moreover, the adhesive films of Comparative Examples 2 and 3, in which silica was used, and in which the BET specific surface area greatly exceeded the upper limit (17 m²/g), had inadequate connection reliability. Moreover, the adhesive films of Comparative Examples 4 and 5, in which silica was used, and in which the maximum particle size did not satisfy Equation (3), also had inadequate connection reliability. Moreover, the adhesive films of Comparative Examples 6 and 7, in which silica was used, and in which the BET specific surface area slightly exceeded the upper limit (17 m²/g), had inadequate connection reliability.

As is evident from the results in Table 5, workability during the connecting process as relates to the adhesive films of Comparative Examples 3 and 7 can be assured by using inorganic particles with a specific surface area of no more than 17 m²/g.

According to the adhesive material of the present invention, any scatter in the distance between a protuberant electrode on a semiconductor element or the like, and the terminal electrode of a motherboard or other circuit board can be eliminated, while enabling the connections to be satisfactorily reliable.

The entire disclosure of the specification, claims and drawing of Japanese Patent Application No. 11-233300 filed on Aug. 19, 1999 are hereby incorporated by reference.

What is claimed is:

1. A circuit connection method, in which a protuberant electrode of an electronic component is connected to a terminal electrode of a circuit board for carrying said electronic component through an adhesive material containing at least one curable resin and inorganic particles, said circuit connection method being characterized in that an adhesive material in which inorganic particles whose specific surface area S (m²/g), as determined by the BET method, satisfies Equation (1) below and whose mean particle size $D_1$ (μm) and maximum particle size $D_2$ (μm) respectively satisfy Equations (2) and (3) below $$3 < S \leq 17 \tag{1}$$

$$D_1 > 5 \tag{2}$$

$$D_2 > 0.5(h_1 + h_2) \tag{3}$$

(wherein $h_1$ represents the height of the protuberant electrode in the electronic component, and $h_2$ represents the height of the terminal electrode in the circuit board) are dispersed in a curable resin in an amount of 10 to 60 vol %, is used as the adhesive material.

2. The circuit connection method according to claim 1, wherein the mean particle size $D_1$ of the inorganic particles further satisfies Equation (4) below $$0.1(h_1 + h_2) \geq D_1 \tag{4}$$

3. The circuit connection method according to claim 1, wherein the electronic component is a semiconductor element.

* * * * *